United States Patent [19]

Lillie et al.

[11] Patent Number: 5,061,438

[45] Date of Patent: Oct. 29, 1991

[54] METHOD OF MAKING A PRINTED CIRCUIT BOARD

[75] Inventors: Edwin D. Lillie, Syracuse; Joseph M. Ilardi, DeWitt; Robert P. Kane, Camillus, all of N.Y.

[73] Assignee: Allied-Signal Inc., Morris Township, Morris County, N.J.

[21] Appl. No.: 815,124

[22] Filed: Dec. 30, 1985

Related U.S. Application Data

[63] Continuation of Ser. No. 534,429, Sep. 21, 1983, abandoned.

[51] Int. Cl.⁵ ............................................. B22F 7/00
[52] U.S. Cl. ........................................ 419/8; 419/10; 419/66; 427/96; 427/97; 428/901
[58] Field of Search .................. 419/8, 39, 42, 48, 10, 419/66; 428/901; 156/901; 427/96, 97; 29/825, 829-831, 846, 848

[56] References Cited

U.S. PATENT DOCUMENTS

| | | | |
|---|---|---|---|
| 2,599,710 | 6/1952 | Hathaway | 29/155.5 |
| 2,963,748 | 12/1960 | Young | 419/8 |
| 3,013,913 | 12/1961 | Croop et al. | 154/43 |
| 3,948,706 | 4/1976 | Schmeckenbecher | 156/89 |
| 4,008,300 | 2/1977 | Ponn | 264/104 |
| 4,183,137 | 1/1980 | Lomerson | 427/97 |
| 4,251,319 | 2/1981 | Bonnie | 156/656 |
| 4,263,341 | 4/1981 | Martyniak | 427/97 |
| 4,290,195 | 9/1981 | Rippere | 427/97 |
| 4,327,124 | 4/1982 | DesMarais | 427/96 |
| 4,378,383 | 3/1983 | Moritz | 427/96 |

Primary Examiner—Stephen J. Lechert, Jr.
Attorney, Agent, or Firm—R. C. Stewart, II; G. H. Fuchs; D. L. Webster

[57] ABSTRACT

The invention is a method for providing an electrically conductive path through a substrate. It is especially useful for electrically connecting together electrically conductive paths (25) on opposite sides of a circuit board (20). The method is characterized by the steps of forming a passage (21) through a substrate (20) that connects to at least one conductive path (25) on each side of the substrate (20), filling the passage (21) with an electrically conductive powder (10), applying pressure with a die (30) to obtain a compacted powder (11) in the passage (21), and then heating the compacted powder (11) to a temperature that increases the conductivity and ductility of the compacted powder (11) and its adhesion to the substrate (20) without adversely affecting the shape or condition of the substrate (20).

10 Claims, 1 Drawing Sheet

METHOD OF MAKING A PRINTED CIRCUIT BOARD

This application is a continuation of application Ser. No. 534,429, filed Sept. 21, 1983, abandoned.

This invention relates to a printed circuit board and more particularly to a dry additive process for providing an electrically conductive path through a circuit board.

Electrical instrumentation utilizes circuit boards for connecting together the components of its circuitry. Each circuit board is comprised of a dielectric substrate having on one or both sides a plurality of electrically conductive paths, arranged in a predetermined manner, to connect together circuit elements mounted to the substrate. A conductive path on each side of the substrate may be connected together by one or more conductors traversing the edge of the board between the sides or by a metal eyelet located in a hole in the board. One example of a circuit board with metal eyelets may be found in U.S. Pat. No. 3,731,252 entitled "Printed Circuit Board Connector" and issued May 1, 1973. The conductive paths may be placed on the substrate by the application of a metal conductor to the substrate and the subsequent removal of portions of the conductor by liquid chemicals or by depositing an electrical conductor on the substrate with chemical plating baths. Examples of other methods of making circuit boards may be found in U.S. Pat. No. 4,327,124 entitled "Method for Manufacturing Printed Circuits Comprising Printing Conductive Ink on Dielectric Surface" issued April 27, 1982; and U.S. Pat. No. 3,013,913 entitled "Molded Printed Circuit," issued Dec. 19, 1961. In all of the methods involving chemicals, wastes are a problem as they must be disposed of without adversely affecting our environment. Further, the methods using chemicals are expensive and relatively complex. In existing methods that apply heat and pressure to a metallic powder and a moldable substrate to obtain a conductive path, the resulting conductive path has material from the substrate dispersed within the conductor lowering its conductivity. This is not acceptable for certain circuit board applications. Further, using metal eyelets to connect conductive paths on opposite sides of a circuit board requires an extra step in the manufacturing process and hence increases the cost of making the board. Still further, the use of a metal eyelet limits the minimum diameter of a passage through a circuit board.

DISCLOSURE OF THE INVENTION

This invention is a method for making a conductive path through a circuit board to connect together the electrically conducting paths on opposite sides of the circuit board. The invention is characterized by the steps of forming a passage through a circuit board that connects to a conductive path on each side of the circuit board, filling the passage in the substrate with an electrically conductive powder, applying pressure to compact the powder in the passage of the substrate, and then heating the compacted powder to its isothermal annealing temperature to increase the conductivity and ductility of the compacted powder and its adhesion to the substrate without adversely affecting the shape or condition of the substrate. The heating step may be omitted when the compacted powder is a metal such as tin.

Accordingly, it is an advantage of this invention to provide a simple method of connecting together conductive paths on opposite sides of a substrate.

An advantage of the method is that it does not require the use of chemicals and hence eliminates chemical wastes, which if not treated properly would provide a hazard to our environment.

Another advantage of the invention is that it reduces the complexity and expense of manufacturing a circuit board.

Another advantage of the invention is that the conductive paths on a circuit board and the conductive passages through a circuit board may be made in one operation.

Another advantage of. the invention is that it provides a method of making a conductive path through a circuit board.

Another advantage of the invention is that it provides a method of making a conductive path through a substrate that can have a smaller diameter than required by a metal eyelet.

DETAILED DESCRIPTION OF THE INVENTION

Figure 1:
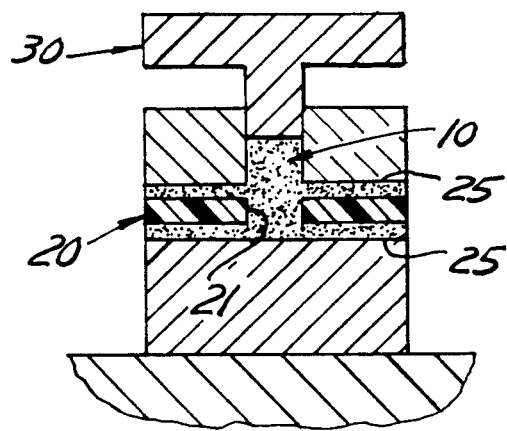
FIGS. 1 through 4 illustrate a method of applying pressure, by a die 30 to an electrically conductive powder 10 in the passage 21 of a substrate 20 to provide a compacted powder 11 in the passage 21 that connects to conductive paths 25 on the substrate 20.
Figure 2:
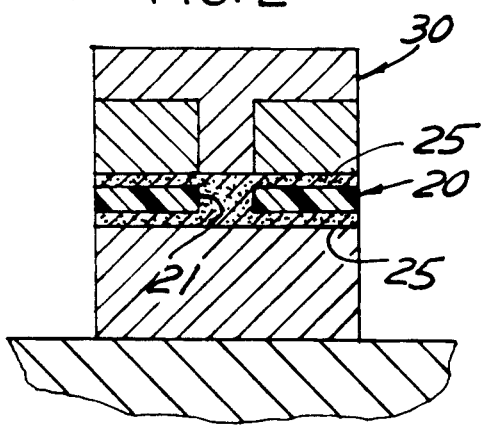
Figure 3:
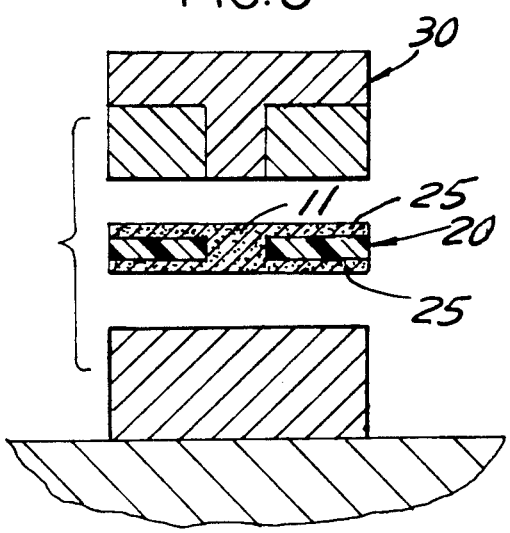
Figure 4:
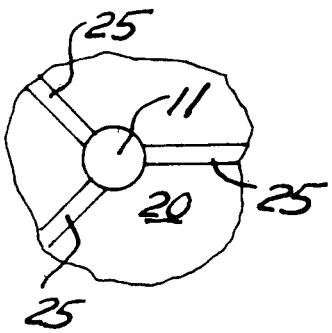

The following are the steps of the method that incorporate the principles of this invention.

Step 1 is the forming of at least one passage 21 through a substrate 20 having electrically conductive paths 25 on opposite sides of the substrate 20. The passage 21 may be made by injection molding a substrate with a passage, drilling a passage into the substrate, or by stamping the substrate with a die to form the passage. The passage 21 is located so as to connect to predetermined conductive paths 25 on opposite sides of the substrate 20. A preferable material for such a substrate would be a plastic such as polyetherimide. Other dielectric materials such as a glass filled plastic or a ceramic may be used. Preferably, a polyetherimide substrate 20 is injection molded to have a passage 21 and grooves on both sides.

Step 2 is the filling or over filling of the passage 21 and any grooves in the substrate 20 with an electrically conductive powder 10. The electrically conductive powder 10 may be a metal or metal alloy such as a copper electrolytic dust which has a particle size less than about 100 microns and is flaky and irregularly shaped.

Step 3 is the application of pressure with die 30 to the electrically conductive powder 10 to provide a compacted powder 11 in the passage 21. Spreading additional powder 10 and compacting it may be accomplished if a thicker compacted powder 11 is desired. The pressure applied may vary depending upon the materials chosen for the conductive powder 10 and the substrate 20. Preferably, the pressure applied is the highest pressure possible that can be applied to the electrically conductive powder 10 without adversely affecting the substrate 20. Such adverse effects would include fracturing of the substrate or the bending or warping of the substrate so that it is not acceptable for use as a circuit board. When a plastic substrate and a copper electrolytic dust are used a pressure of about 20,000 to 55,000 psi at room temperature will achieve the desired result. Such a pressure range is sufficient to cold work the metal particles of the powder to increase the bulk density of the resulting compacted particles. Alternately, the die 30 may include a pin shaped-portion that extends through the powder 10 in the passage 21 so the passage 21 is not blocked by the compacted powder.

Step 4 is the heating of the compacted powder 11 in the passage 21. Depending on the type of conductive powder and substrate material 20 used, the temperature should be sufficient to increase the conductivity and ductility of the compacted powder 11 and its adhesion to the substrate 20 without adversely affecting the substrate, e.g., warping, bending or cracking. Preferably, the compacted powder is heated to a temperature at about the isothermal annealing temperature of the compacted powder for a period of 20 to 60 minutes. For a copper electrolytic dust this temperature is about 200 degrees centigrade. This temperature is acceptable when the substrate material is a plastic such as polyetherimide and prevents the dispersion of the substrate material into the final conductive path except at the interface between the conductive path and substrate. The heating step may be accomplished in an oven or with a heated die. In some instances where a powdered metal such as tin is used to make a conductive path, applying pressure to compact the tin is sufficient to provide the conductive path without the need to heat the compacted powder. For tin a pressure above 10,000 psi will be sufficient to compact the powder.

Alternately, grooves and passages connecting to the grooves are formed into the board in one operation and the conductive paths 25 are made at the same time the conductive path 11 through the substrate 20 is made. This is accomplished by filling the grooves and passages 21 with an electrically conductive powder at the same time and then applying pressure and heat to the powder in the grooves and passages.

What is claimed is:

1. A method of making a circuit board from a substrate said board having at least one electrically conductive path on one side thereof connected to a conductive path through the board, said method comprising the steps of:

forming a passage through the substrate and at least one groove on at least one side of the substrate with at least one groove connected to said passage;

substantially completely filling the passage and at least one groove with an electrically conductive metal powder;

applying pressure to said powder to compact the powder in the passage and the groove forming compacted powder which substantially completely fills said passage; and heating the compacted powder to about its isothermal annealing temperature.

2. The method as described in claim 1 wherein the step of applying pressure to compact the powder comprises:

applying the maximum pressure to the powder and substrate which can be applied without making the substrate unacceptable for use as a circuit board.

3. The method as described in claim 1 wherein the pressure applied is about 20,000 to 55,000 psi at room temperature.

4. The method as described in claim 2 wherein the pressure applied is about 20,000 to 55,000 psi at room temperature.

5. The method as described in claim 1 wherein the electrically conductive powder is a copper electrolytic dust and the temperature to which the compacted powder is heated is about 200 degrees centigrade for a period of 20 to 60 minutes.

6. The method as described in claim 2 wherein the electrically conductive powder is a copper electrolytic dust and the temperature to which the compacted powder is heated is about 200 degrees centigrade for a period of 20 to 60 minutes.

7. The method as described in claim 1 wherein the conductive powder is tin.

8. The method as described in claim 7 wherein the pressure applied is above 10,000 psi at room temperature.

9. The method as described in claim 3 wherein the electrically conductive powder is a copper electrolytic dust and wherein the compacted powder is heated to a temperature of about 200 degrees centigrade for a period of 20 to 60 minutes.

10. The method as described in claim 4 wherein the electrically conductive powder is a copper electrolytic dust and wherein the compacted powder is heated to a temperature of about 200 degrees centigrade for a period of 20 to 60 minutes.

* * * * *